(12) United States Patent
Park et al.

(10) Patent No.: US 11,070,102 B2
(45) Date of Patent: Jul. 20, 2021

(54) MOTOR USING PRINTED CIRCUIT BOARD AND METHOD FOR MANUFACTURING THE SAME

(71) Applicants: Hyundai Motor Company, Seoul (KR); Kia Motors Corporation, Seoul (KR)

(72) Inventors: Jun Hwan Park, Seoul (KR); Seok Won Lee, Chungcheongnam-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 147 days.

(21) Appl. No.: 16/205,866

(22) Filed: Nov. 30, 2018

(65) Prior Publication Data

US 2019/0393749 A1    Dec. 26, 2019

(30) Foreign Application Priority Data

Jun. 22, 2018    (KR) .......................... 10-2018-0072123

(51) Int. Cl.
| | |
|---|---|
| *H02K 3/26* | (2006.01) |
| *H02K 15/04* | (2006.01) |
| *H05K 1/14* | (2006.01) |
| *H05K 1/16* | (2006.01) |

(52) U.S. Cl.
CPC ........... *H02K 3/26* (2013.01); *H02K 15/0407* (2013.01); *H05K 1/147* (2013.01); *H05K 1/165* (2013.01); *H05K 2201/1009* (2013.01)

(58) Field of Classification Search
CPC ........ H02K 3/26; H02K 15/0407; H02K 3/47; H05K 1/147; H05K 1/165; H05K 2201/1009
See application file for complete search history.

(56) References Cited

U.S. PATENT DOCUMENTS 4,115,915 A  *  9/1978  Godfrey .................... H02K 3/12
                                                    29/596
8,228,387 B2    7/2012  Huang

FOREIGN PATENT DOCUMENTS

| JP | 2008-228472 A | 9/2008 |
|---|---|---|
| KR | 20-2011-0004579 U | 5/2011 |

* cited by examiner

*Primary Examiner* — Thomas Truong
(74) *Attorney, Agent, or Firm* — Mintz Levin Cohn Ferris Glovsky and Popeo, P.C.; Peter F. Corless

(57) ABSTRACT

A motor using a printed circuit board may include: a first base part forming a first circuit board on which a coil pattern is printed; a second base part forming a second circuit board on which the coil pattern is printed, the second base part spaced apart from the first base part; and a plurality of side parts forming side circuit boards on which the coil pattern is printed, the plurality of side parts connected to the first base part and the second base part, respectively, such that the coil pattern successively connects the first base part, the second base part, and the plurality of side parts.

16 Claims, 9 Drawing Sheets

[FIG. 1]
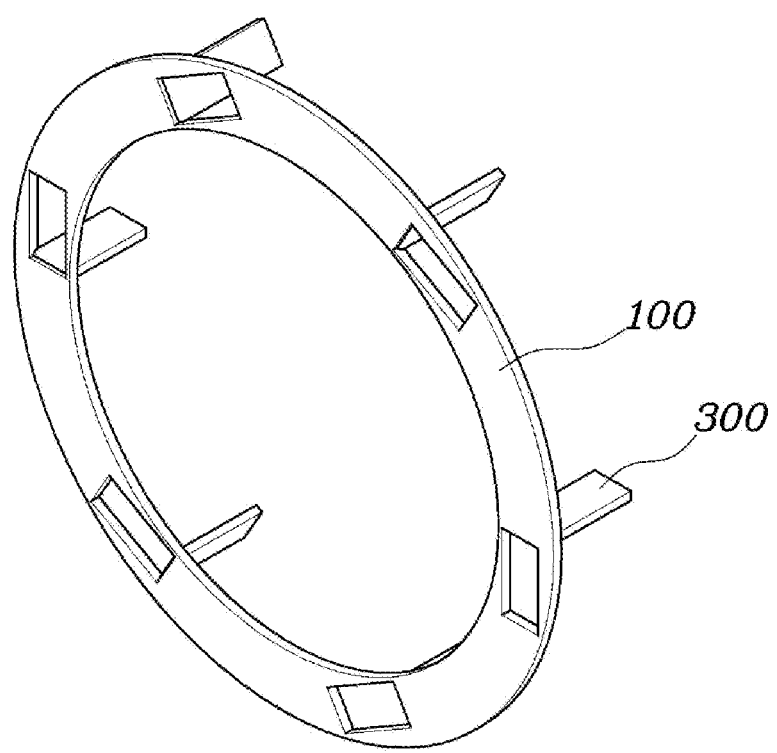

[FIG. 2]
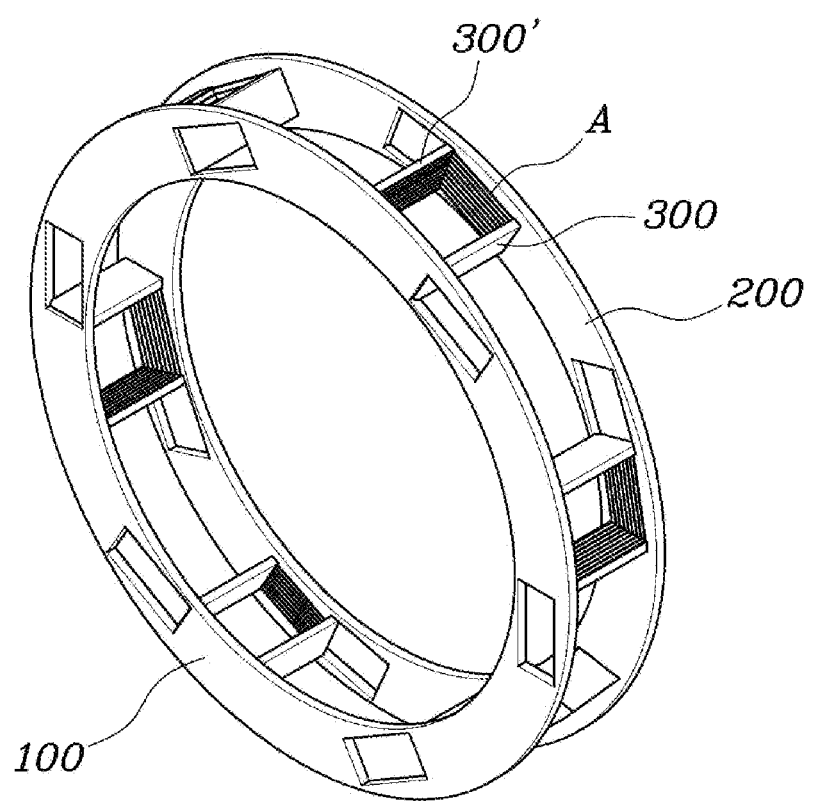

[FIG. 3]
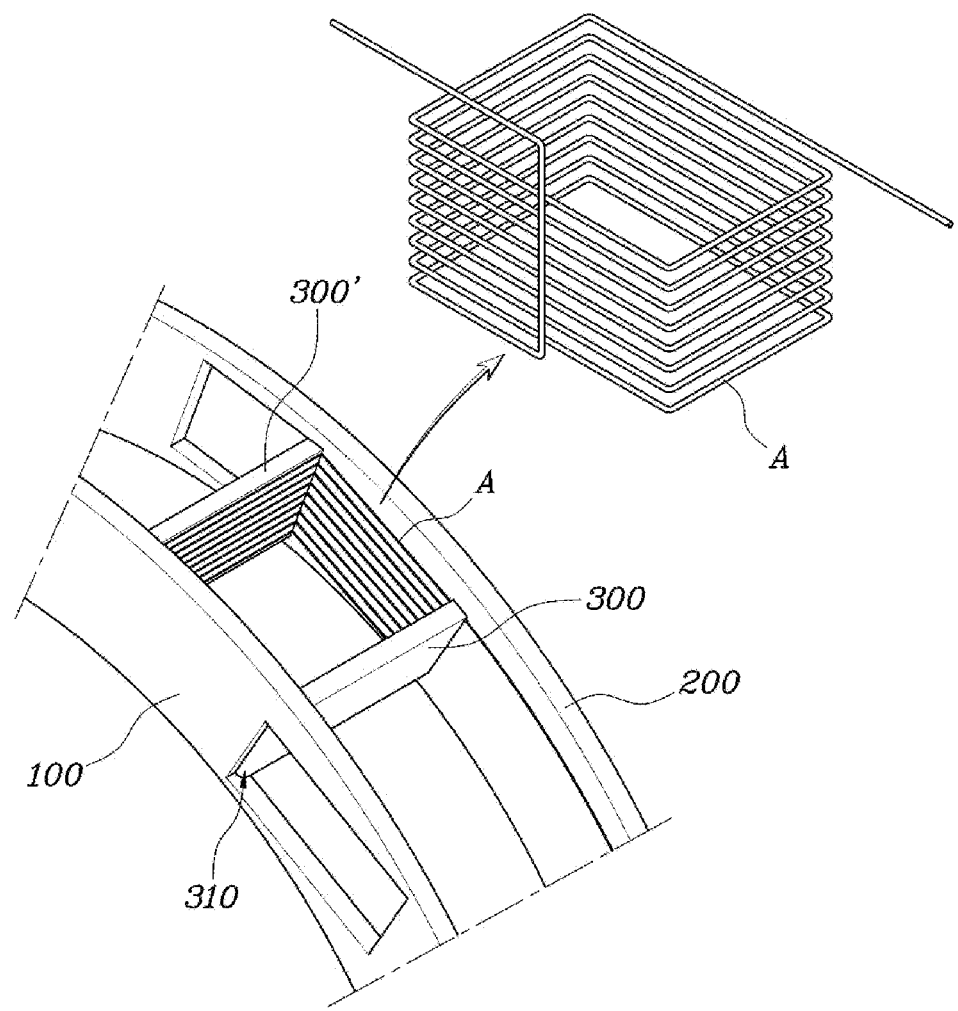

[FIG. 4]
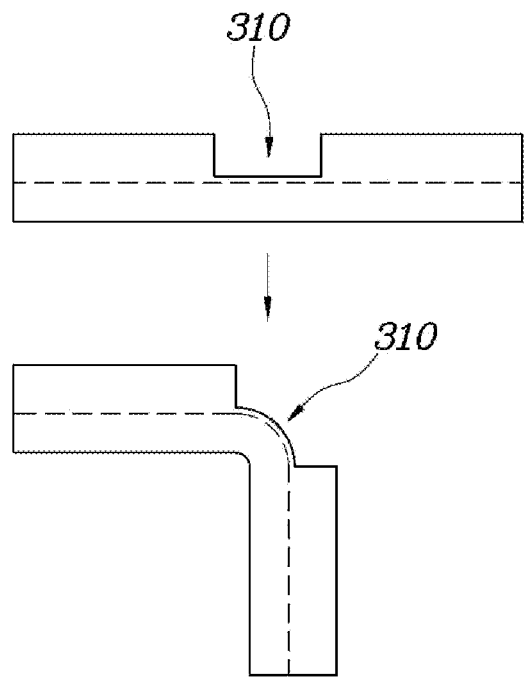
[FIG. 5]
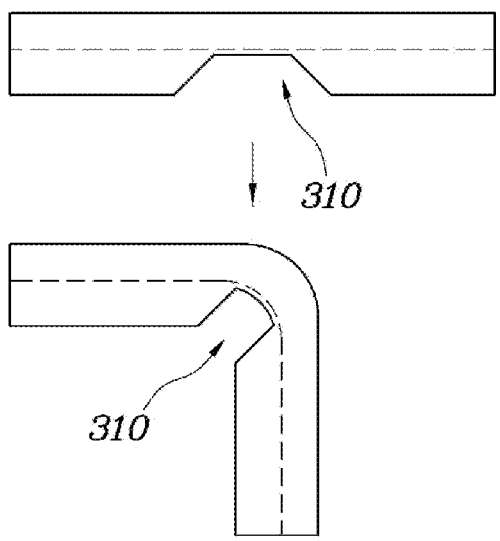

[FIG. 6]
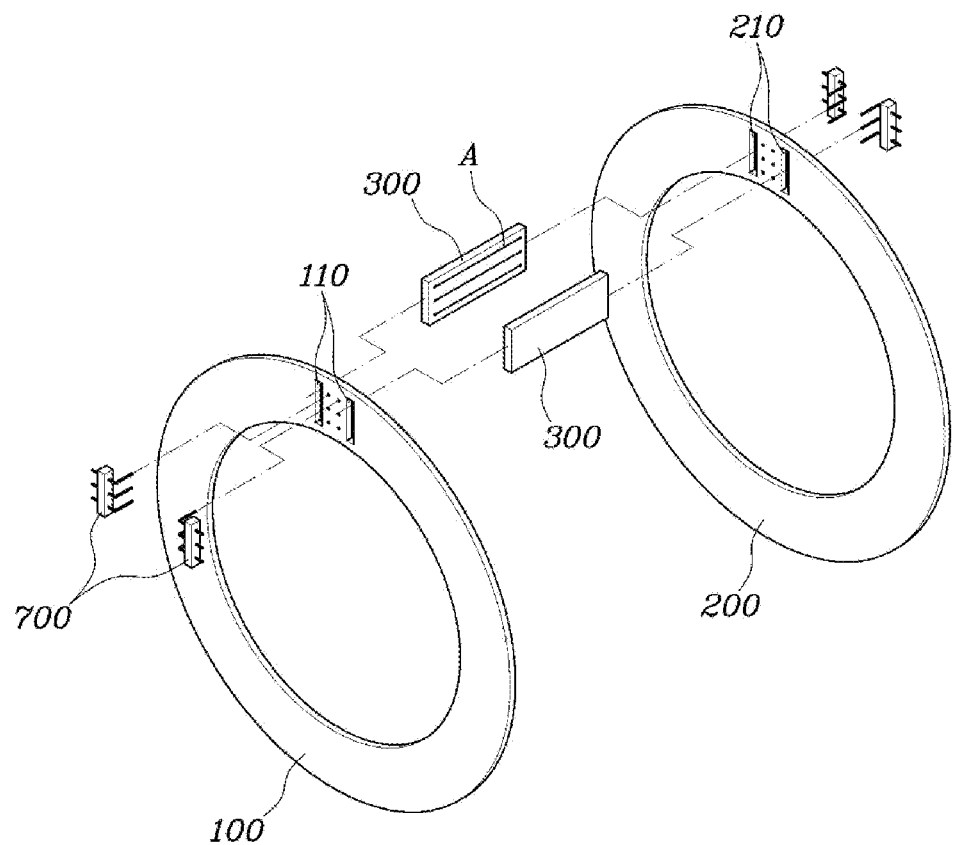

[FIG. 7]
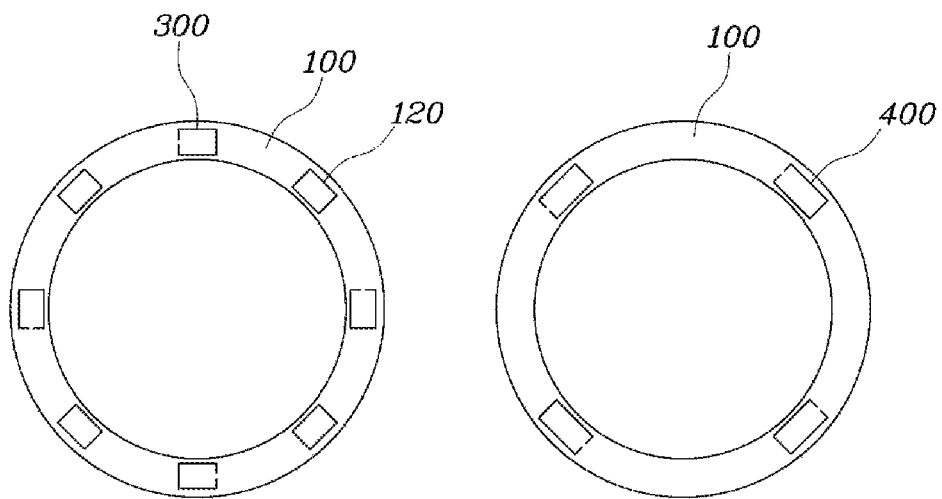

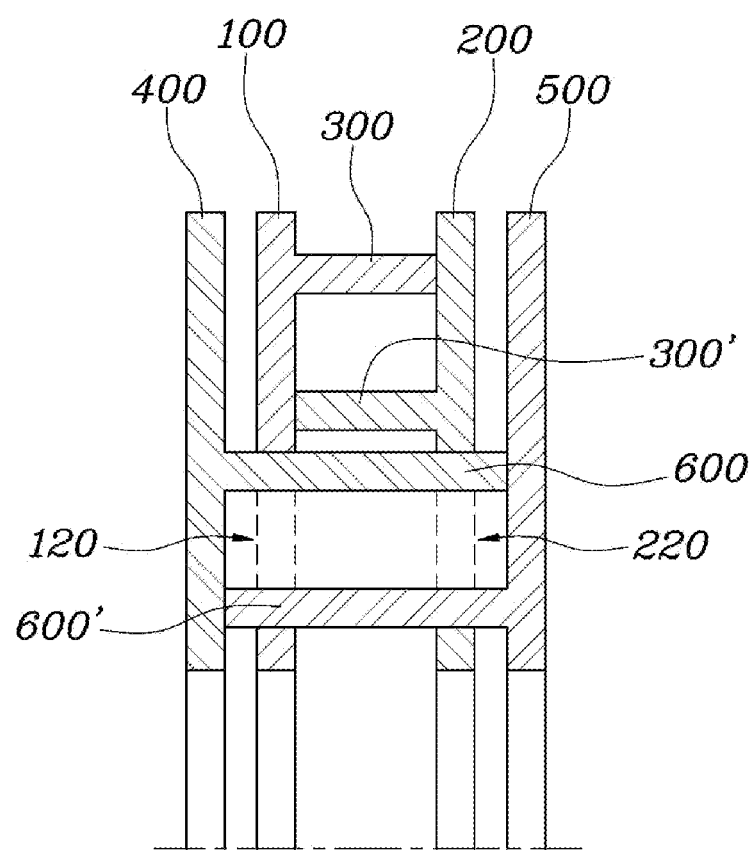
[FIG. 8]

[FIG. 9]
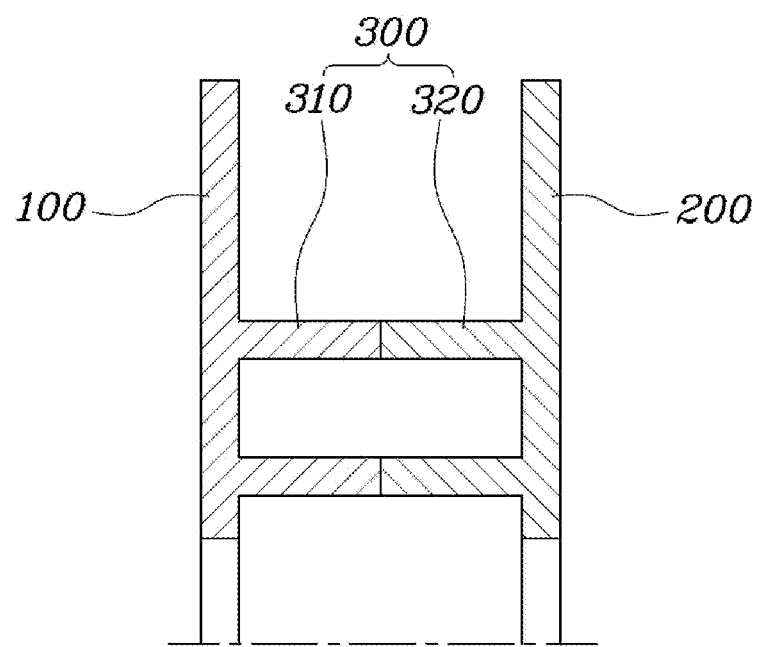

[FIG. 10]
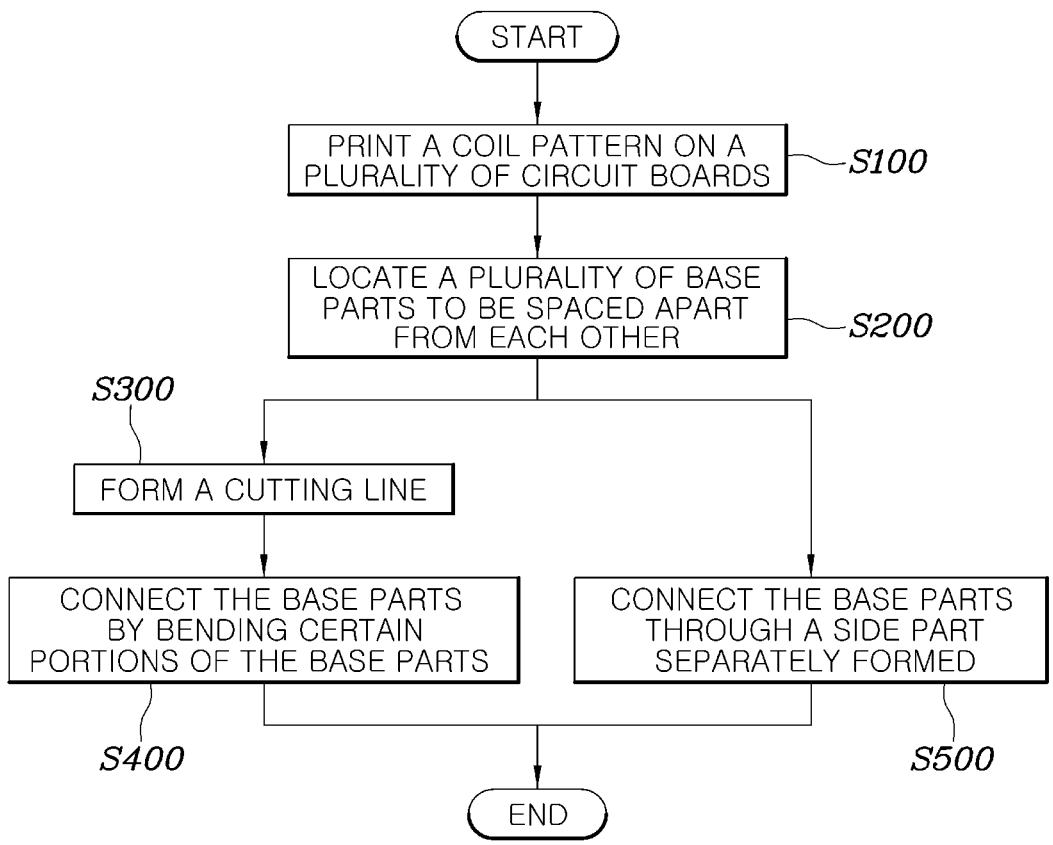

MOTOR USING PRINTED CIRCUIT BOARD AND METHOD FOR MANUFACTURING THE SAME

CROSS-REFERENCE TO RELATED APPLICATION

The present application claims priority to Korean Patent Application No. 10-2018-0072123, filed on Jun. 22, 2018 in the Korean Intellectual Property Office, the entire contents of which are incorporated herein by reference.

BACKGROUND OF THE DISCLOSURE

Field of the Disclosure

The present disclosure relates to a motor using a printed circuit board and a method for manufacturing the same, and more particularly, to a method for manufacturing a three-dimensional motor by connecting a plurality of circuit boards on which coil patterns are printed.

Description of the Related Art

Motors have been used in a wide range of industrial applications for converting electrical energy into mechanical energy to generate rotational force. As is generally known in the art, a motor includes a rotor and a stator. A coil through which current flows is wound on the stator. Conventionally, a winding machine has been used to wind the coil around the stator.

However, the winding operation can be complex and require an expensive winding device. Various divided winding methods have been used to streamline this operation. There have been further problems in these methods, however, in that when the coil is wound on the divided stator, the structural rigidity is reduced.

Moreover, the "teeth" of the stator must be shaped in a particular manner to allow for the previously wound coil to be inserted thereon. Furthermore, the volume of the motor must be enlarged due to the space occupied by the end turn for a coil with extra length, often causing the coil to short circuit during compression of the end turn.

The foregoing is intended merely to aid in the understanding of the background of the present disclosure, and is not intended to mean that the present disclosure falls within the purview of the related art that is already known to those skilled in the art.

SUMMARY OF THE DISCLOSURE

The present disclosure is intended to solve the above problems, and an object of the present disclosure is to provide a technology relating to a motor and a method for manufacturing the same, which can wind a coil of a motor in a pattern on a printed circuit board, and connect it to each other three-dimensionally, thus enhancing the productivity thereof.

In accordance with embodiments of the present disclosure, a motor using a printed circuit board may include: a first base part forming a first circuit board on which a coil pattern is printed; a second base part forming a second circuit board on which the coil pattern is printed, the second base part spaced apart from the first base part; and a plurality of side parts forming side circuit boards on which the coil pattern is printed, the plurality of side parts connected to the first base part and the second base part, respectively, such that the coil pattern successively connects the first base part, the second base part, and the plurality of side parts.

Each side part can be formed by bending a portion of the first base part or a portion of the second base part, the end portion of each side part bent on the first base part can be coupled to the second base part, and the end portion of each side part bent on the second base part can be coupled to the first base part.

A cutting line in which a part of a thickness of the first or second circuit board is cut can be formed on a surface of the first base part or a surface of the second base part, and each side part can be formed by bending the portion of the first base part or the portion of the second base part along the cutting line.

The cutting line can be formed on a surface opposite of the surface on which the coil pattern is printed.

The coil pattern, which is printed on the first base part, the second base part, and the plurality of side parts, can be successively formed, in order, on the first base part, a bent portion of a side part among the plurality of side parts bent on the first base part, the second base part, and a bent portion of another side part among the plurality of side parts bent on the second base part.

At least one end portion of the plurality of side parts can be coupled to the first base part or the second base part by soldering.

Coupling holes into which the plurality of side parts are penetrated or inserted can be formed on the first base part and the second base part, and the plurality of side parts can be coupled to the first base part and the second base part such that both end portions of a particular side part are penetrated or inserted into the coupling holes formed on the first base part and the second base part.

The motor using the printed circuit board can further include a connector disposed between the first base part or the second base part and the plurality of side parts to successively connect the a portion of the coil pattern printed on the first base part or the second base part to a portion of the coil pattern printed on the side part.

The motor using the printed circuit board can further include a third base part forming a third circuit board on which the coil pattern is printed, the third base part located at a side opposite of the second base part and spaced apart from the first base part; a fourth base part forming a fourth circuit board on which the coil pattern is printed, the fourth base part located at a side opposite of the first base part and spaced apart from the second base part; and a plurality of auxiliary side parts forming auxiliary side circuit boards on which the coil pattern is printed, the plurality of auxiliary side parts connected to the third base part and the fourth base part, respectively, such that the coil pattern successively connects the third base part, the fourth base part, and the plurality of auxiliary side parts. Through-holes can be formed in the first base part and the second base part, respectively, and the plurality of auxiliary side parts are connected to the third base part and the fourth base part, respectively, by penetrating the through-holes of the first base part and the second base part.

Each side part can include a first side part having a portion bent on the first base part and a second side part having a portion bent on the second base part, and an end portion of the first side part and an end portion of the second side part can be connected to each other to form each side part.

Furthermore, in accordance with embodiments of the present disclosure, a method for manufacturing a motor using a printed circuit board can include: printing a coil pattern on a plurality of circuit boards including a first base part and a second base part, such that the first base part is spaced apart from the second base part; and forming a plurality of side parts on which the coil pattern is printed, the plurality of side parts connected to the first base part and the second base part, respectively, such that the coil pattern successively connects the first base part, the second base part, and the plurality of side parts.

A portion of the first base part or a portion of the second base part can be bent to form each side part, an end portion of each side part bent on the first base part can be coupled to the second base part, and an end portion of each side part bent on the second base part can be coupled to the first base part.

The method for manufacturing the motor using the printed circuit board can further include forming a cutting line in which a part of a thickness of the first or second circuit board is cut is formed on a surface of the first base part or a surface of the second base part, wherein each side part is formed by bending the portion of the first base part or the portion of the second base part along the cutting line.

At least one end portion of the plurality of side parts can be coupled to the first base part or the second base part by soldering.

The method can further include forming coupling holes into which the plurality of side parts are penetrated or inserted are formed on the first base part and the second base part, wherein the plurality of side parts are coupled to the first base part and the second base part such that both end portions of a particular side part are penetrated or inserted into the coupling holes formed on the first base part and the second base part.

The method can further include forming a connector disposed between the first base part or the second base part and the plurality of side parts to successively connect the a portion of the coil pattern printed on the first base part or the second base part to a portion of the coil pattern printed on the side part.

The plurality of circuit boards can further include a third base part forming a third circuit board on which the coil pattern is printed, the third base part located at a side opposite of the second base part and spaced apart from the first base part, and a fourth base part forming a fourth circuit board on which the coil pattern is printed, the fourth base part located at a side opposite of the first base part and spaced apart from the second base part.

The method can further include forming a plurality of auxiliary side parts forming auxiliary side circuit boards on which the coil pattern is printed, the plurality of auxiliary side parts connected to the third base part and the fourth base part, respectively, such that the coil pattern successively connects the third base part, the fourth base part, and the plurality of auxiliary side parts; and forming through-holes in the first base part and the second base part, respectively, and the plurality of auxiliary side parts are connected to the third base part and the fourth base part, respectively, by penetrating the through-holes of the first base part and the second base part.

According to the motor using the printed circuit board of the present disclosure and the method for manufacturing the same, it is unnecessary to require the winding device and the skilled technology by replacing the coil pattern of the motor with the PCB pattern, and it is possible to reduce the time required for manufacturing, thus enhancing the productivity of the motor.

In addition, it is possible to reduce the space occupied by the end turn of the coil, thus reducing the volume of the motor.

In addition, it is possible to eliminate the compression process of the end turn, thus preventing short circuits of the coil.

BRIEF DESCRIPTION OF THE DRAWINGS

The above and other objects, features and other advantages of the present disclosure will be more clearly understood from the following detailed description when taken in conjunction with the accompanying drawings, in which:

FIG. 1 is a perspective diagram of a base part in accordance with an embodiment of the present disclosure;

FIG. 2 is a perspective diagram of a motor using a printed circuit board in accordance with an embodiment of the present disclosure;

FIG. 3 is an enlarged diagram of the motor using the printed circuit board in accordance with an embodiment of the present disclosure;

FIGS. 4 and 5 illustrate a cutting line formed on the base part in accordance with an embodiment of the present disclosure;

FIG. 6 illustrates a motor using a printed circuit board in accordance with another embodiment of the present disclosure;

FIG. 7 illustrates a base part of a motor using a printed circuit board in accordance with still another embodiment of the present disclosure;

FIG. 8 is a cross-sectional diagram of the motor using the printed circuit board in accordance with still another embodiment of the present disclosure;

FIG. 9 is a cross-sectional diagram of a motor using a printed circuit board in accordance with yet another embodiment of the present disclosure; and FIG. 10 is a flowchart of a method for manufacturing a motor using a printed circuit board in accordance with an embodiment of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Specific structural and functional descriptions of the embodiments of the present disclosure disclosed in the specification or application are only for the purpose of illustrating the embodiments of the present disclosure, and the embodiments in accordance with the present disclosure can be embodied in various forms and should not be construed as limited to the embodiments set forth in the specification or application.

Various modifications and various forms can be made in the embodiments in accordance with the present disclosure, so that specific embodiments are illustrated in the drawings and described in detail in the specification or application. It should be understood, however, that it is not intended to limit the embodiments in accordance with the concepts of the present disclosure to the particular disclosed forms, but includes all modifications, equivalents, and alternatives falling within the sprit and technical scope of the present disclosure.

The terms "first" and/or "second," and the like are used to illustrate various components, but the components should not be limited by the terms. The terms are used to differentiate one element from another, for example, a first component can be referred to as a second component, and similarly, the second component can be also referred to as the first component without departing from claims in accordance with the concepts of the present disclosure.

It will be understood that when an element is referred to as being "connected" or "coupled" to another element, it can be "directly connected" or "coupled" to the other element, but also to the other element with other elements interposed therebetween. On the other hand, it should be understood that any configuration element has no other element in between the time stated that "directly connected" or "directly coupled" to another element. Other expressions that describe the relationship between elements, such as "between" and "directly between" or "adjacent to" and "directly adjacent to" should be interpreted as well.

The terminology used the specification is for the purpose of describing particular embodiments only and is not intended to limit the present disclosure. The singular forms are intended to include the plural forms as well, unless the context clearly indicates otherwise. In the specification, it will be further understood that the terms "comprises" or "includes," and the like specify the presence of stated features, integers, steps, operations, elements, components or combination thereof, but do not preclude the presence or addition of one or more other features, integers, steps, operations, elements, components, or combination thereof.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be additionally interpreted as having a meaning that is consistent with their meaning in the context of the relevant art, and will not be interpreted in an idealized or overly formal sense unless expressly so defined in the specification.

Hereinafter, embodiments of the present disclosure will be described in detail with reference to the accompanying drawings. The same reference numerals denoted in each drawing denote the same members.

FIG. 1 is a perspective diagram of a base part in accordance with an embodiment of the present disclosure, FIG. 2 is a perspective diagram of a motor using a printed circuit board in accordance with an embodiment of the present disclosure, and FIG. 3 is an enlarged diagram of the motor using the printed circuit board in accordance with an embodiment of the present disclosure.

Referring to FIGS. 1 to 3, a motor using a printed circuit board in accordance with embodiments of the present disclosure includes a first base part 100 forming a circuit board (i.e., "first circuit board") on which a coil pattern A is printed; a second base part 200 forming a circuit board (i.e., "second circuit board") on which the coil pattern A is printed, and located to be spaced apart from the first base part 100; and a plurality of side parts 300 forming circuit boards (i.e., "side circuit boards") on which the coil patterns A are printed, and connected to the first base part 100 and the second base part 200, respectively, which are located to be spaced apart from each other, so that the printed coil patterns A are successively connected to the coil patterns A printed on the first base part 100 and the second base part 200.

The first base part 100 and the second base part 200 can be located to be spaced apart from each other, and the plurality of side parts 300 can be connected to the first base part 100 and the second base part 200, respectively, so that the coil patterns A printed on the first base part 100 and the second base part 200 are successively connected to each other.

As illustrated in FIG. 1, the first base part 100 and the second base part 200 can be a circuit board on which the coil pattern A is printed. That is, the coil pattern A wound on a stator of the motor is formed using a Printed Circuit Board (PCB).

The first base part 100 and the second base part 200 serve as the end turn of the coil, and the first base part 100 and the second base part 200 can further include a winding configuration such as a Delta-connection or a Y-connection for distributing power to the coil.

Since a conventional motor using a PCB uses only a planar PCB, it is difficult to generate sufficient magnetic force and thereby, the torque for rotating a rotor is small, such that there has been a limitation to be inevitably applied only to a small motor. However, the present disclosure can further include a side part 300 connected between the first base part 100 and the second base part 200, thus implementing the coil in the three-dimensional shape. Accordingly, it is possible to simplify the manufacturing process of the motor that requires a large torque using the PCB for the coil winding, thus enhancing the productivity of the motor.

In embodiments of the present disclosure, the side part 300 can be formed by bending a certain portion of the first base part 100 or the second base part 200. The end portion of the side part 300 bent on the first base part 100 can be coupled to the second base part 200, and the end portion of the side part 300 bent on the second base part 200 can be coupled to the first base part 100.

As illustrated, the certain portion bent on the first base part 100 or the second base part 200 can be a square. The three sides constituting the square can be cut in a '⊏' shape and are bent along one side that is not cut to form the side part 300. The three sides constituting the square that is cut in the '⊏' shape can be completely cut to penetrate the first base part 100 or the second base part 200, and a certain thickness thereof can be cut to be removed so that the certain portion of the '⊏' shape can be spaced apart from the first base part 100 or the second base part 200 at the three sides thereof before bent on the first base part 100 or the second base part 200.

That is, as illustrated, the certain portion of the first base part 100 or the second base part 200 can be bent along the side that is not cut to form the side part 300 connecting between the first base part 100 and the second base part 200. The end portion of the side part 300 bent on the first base part 100 can be coupled to the second base part 200, and the end portion of the side part 300 bent on the second base part 200 can be coupled to the first base part 100.

The end portion of the side part 300 bent on the first base part 100 or the second base part 200 can be coupled to the first base part 100 or the second base part 200 by soldering so that the coil pattern A printed on the side part 300 is connected to the coil pattern A printed on the first base part 100 or the second base part 200. In addition, a connector can be used, as described in greater detail below.

The side part 300 can be manufactured in a simple process by being bent on the first base part 100 or the second base part 200, and the side part 300 can connect between the first base part 100 and the second base part 200 by coupling it only to the base part of the opposite side thereof, thus enhancing convenience of the manufacturing process.

More specifically, a cutting line 310 in which a part of the thickness of the circuit board is cut is formed on one surface of the first base part 100 or the second base part 200, and the side part 300 can be formed by bending a certain portion of the first base part 100 or the second base part 200 along the cutting line 310.

FIGS. 4 and 5 illustrate the cutting line 310 formed on the base part in accordance with embodiments of the present disclosure.

As shown in FIGS. 4 and 5, the cutting line 310 can be formed on the inner surface in the bent direction or can be also formed on the outer surface thereof when the certain portion of the first base part 100 or the second base part 200 is bent in order to form the side part 300. The cutting line 310 can be formed by cutting a part of the thickness of the circuit board through a process such as milling.

Specifically, as illustrated in FIG. 4, the cutting line 310 can be formed on the outer surface in the bent direction and a certain portion of the first base part 100 or the second base part 200 can be bent along the cutting line 310 to form the side part 300, and as illustrated in FIG. 5, the cutting line 310 can be formed on the inner surface in the bent direction and a certain portion of the first base part 100 or the second base part 200 can be also bent along the cutting line 310 to form the side part 300.

Herein, it is important that the cutting line 310 of the first base part 100 or the second base part 200 is formed on the opposite surface of the surface on which the coil pattern is printed. This is because the printed coil pattern is not broken by the cutting line 310 until the cutting line 310 is formed on the opposite surface of the surface on which the coil pattern of the PCB is printed.

Accordingly, as illustrated in FIG. 4, when the coil pattern is printed on the lower surface of the base part, the cutting line 310 should be formed on the upper surface thereof, and as illustrated in FIG. 5, when the coil pattern is printed on the upper surface of the base part, the cutting line 310 should be formed on the lower surface thereof. Accordingly, the cutting line 310 can be formed without cutting the connection of the printed coil pattern and the side part 300 can be formed by bending a certain portion of the first base part 100 or the second base part 200.

Referring again to FIGS. 1 to 3, the plurality of side parts 300 include the side part 300 formed to be bent on the first base part 100 and the side part 300 formed to be bent on the second base part 200; and the end portions thereof can be coupled to the second base part 200 and the first base part 100, respectively. Accordingly, the plurality of side parts 300 can be connected to the first base part 100 and the second base part 200, respectively, and a space, which forms the closed loop, can be formed by the first base part 100, the second base part 200, and two side parts 300, 300' connecting them.

That is, the space, which forms the closed loop, is formed by the first base part 100 and the second base part 200 that are spaced apart from each other, and the two side parts 300, 300' connecting them, and the coil patterns A printed on the first base part 100, the second base part 200, and the side part 300 can be successive in the order of the first base part 100, the side part 300 formed to be bent on the first base part 100, the second base part 200, and the side part 300' formed to be bent on the second base part 200.

Particularly, as illustrated in FIG. 2, the coil patterns A printed on the first base part 100, the second base part 200, and the two side parts 300, 300' connecting them are printed so that a single coil A like a spring is sequentially successive continuously on the first base part 100, the second base part 200, and the two side parts 300, 300' connecting them, and both ends of the coil A can be connected to another adjacent closed loop spaces, respectively.

In the motor using the printed circuit board in accordance with an embodiment of the present disclosure, the coil pattern A is printed on the surfaces of the first base part 100 and second base part 200 facing each other, and certain portions of the first base part 100 and the second base part 200 are bent in the direction facing each other, respectively, to form the two side parts 300, 300' so that the side part 300 bent on the first base part 100 can be coupled to the second base part 200 and the side part 300' bent on the second base part 200 can be coupled to the first base part 100. Herein, the cutting lines 310 of the first base part 100 and the second base part 200 can be formed on the surfaces not facing each other on which the coil patterns A are not printed.

Accordingly, the closed loop can be formed by connecting the first base part 100, the side part 300 formed to be bent on the first base part 100, the second base part 200, and the side part 300' formed to be bent on the second base part 200, and the coil patterns A printed on the inner surface of the closed loop can be successive with each other.

On the contrary, the coil patterns A are printed on the surfaces of the first base part 100 and the second base part 200 not facing each other, and certain portions of the first base part 100 and the second base part 200 are bent in the direction facing each other, respectively, to form the two side parts 300, 300' so that the side part 300 bent on the first base part 100 can be coupled to the second base part 200 and the side part 300' bent on the second base part 200 can be coupled to the first base part 100. Herein, the cutting lines of the first base part 100 and the second base part 200 can be formed on the surfaces facing each other on which the coil patterns A are not printed.

In this case, the closed loop can be formed by connecting the first base part 100, the side part 300 formed to be bent on the first base part 100, the second base part 200, and the side part 300' formed to be bent on the second base part 200, and the coil patterns A printed on the outer surface of the formed closed loop can be successive with each other.

However, in this case, in order to connect the printed coil pattern A of the side part 300 to the coil pattern A printed on the first base part 100 or the second base part 200, coupling holes (not illustrated) that the upper surface and lower surface thereof are penetrated are formed on the first base part 100 and the second base part 200, and the side part 300 should be coupled to the first base part 100 or the second base part 200 while penetrating the coupling hole (not illustrated).

FIG. 6 illustrates a motor using a printed circuit board in accordance with another embodiment of the present disclosure.

As shown in FIG. 6, the motor using the printed circuit board in accordance with another embodiment of the present disclosure can connect the first base part 100 and the second base part 200 through a plurality of side parts 300 separately formed.

When the length of the motor in the axial direction is longer than the diameter of the motor, the diameters of the first base part 100 and the second base part 200 should be also increased in order to form the side part 300 by bending, such that the separately formed side part 300 formed of the circuit board on which the coil pattern A is printed can connect between the first base part 100 and the second base part 200.

Even in this case, likewise, both side end portions of the side part 300 can be coupled to the first base part 100 or the second base part 200 by soldering so that the coil printed on the side part 300 is connected to the coil printed on the first base part 100 or the second base part 200.

In another example, the motor using the printed circuit board can further include a connector 700 provided between the first base part 100 or the second base part 200 and the side part 300 to successively connect the coil printed on the first base part 100 or the second base part 200 to the coil printed on the side part 300. That is, the motor using the printed circuit board can further include a configuration of the connector 700 for coupling the side part 300 to the first base part 100 or the second base part 200 to successively connect the coil printed on the first base part 100 or the second base part 200 to the coil printed on the side part 300.

Coupling holes 110, 210 that the side parts 300 are penetrated or inserted into the first base part 100 and the second base part 200 are formed, and the side parts 300 can be coupled to the first base part 100 and the second base part 200 while both side end portions thereof are penetrated or inserted into the coupling holes 110, 210 formed on the first base part 100 and the second base part 200.

When the coil pattern A is printed on the inner surface of the closed loop formed by the first base part 100, the second base part 200, and the two side parts 300, the coupling holes 110, 210 into which the side parts 300 are inserted can be simply formed on the first base part 100 and the second base part 200.

However, when the coil pattern A is printed on the outer surface of the closed loop formed by the first base part 100, the second base part 200, and the two side parts 300, the coupling holes 110, 210 penetrating the upper surface and lower surface thereof should be formed on the first base part 100 and the second base part 200.

That is, the coupling holes 110, 210 penetrating the upper surface and lower surface thereof are formed on the first base part 100 and the second base part 200; the plurality of side parts 300 are formed in the state inserted into the coupling holes 110, 210 of the first base part 100 and the second base part 200; and the coil printed on the first base part 100 or the second base part 200 is successively connected to the coil printed on the side part 300 through the connector 700.

FIG. 7 illustrates a base part of a motor using a printed circuit board in accordance with still another embodiment of the present disclosure, and FIG. 8 is a cross-sectional diagram of the motor using the printed circuit board in accordance with still another embodiment of the present disclosure.

As shown in FIGS. 7 and 8, the motor using the printed circuit board can further include a third base part 400 forming a circuit board (i.e., "third circuit board") on which a coil pattern A is printed, and located at the opposite side of the second base part 200 side to be spaced apart from the first base part 100, a fourth base part 500 forming a circuit board (i.e., "fourth circuit board") on which the coil pattern A is printed, and located at the opposite side of the first base part 100 side to be spaced apart from the second base part 200, and a plurality of auxiliary side parts 600 forming circuit boards (i.e., "auxiliary side circuit boards") on which the coil patterns A are printed, and connected to the third base part 400 and the fourth base part 500 so that the printed coils are successively connected to the coils printed on the third base part 400 and the fourth base part 500; and through-holes 120, 220 are formed on the first base part 100 and the second base part 200, and the auxiliary side parts 600 can be connected to the third base part 400 and the fourth base part 500, respectively, through the through-holes 120, 220 of the first base part 100 and the second base part 200.

Unlike the embodiment of FIGS. 1 to 3, in the embodiment of FIGS. 7 and 8, when the slot interval of the stator is narrow and thereby, the area for forming the side part from the first base part 100 and the second base part 200 is insufficient, the motor using the printed circuit board can be configured to further include the third base part 400 and the fourth base part 500 on the outsides of the first base part 100 and the second base part 200, respectively. Particularly, when the side part 300 is formed by bending a certain portion of the first base part 100 or the second base part 200, the number of the side parts 300 that can be maximally formed is limited, such that the auxiliary side part 600 is further formed through the separate third base part 400 and fourth base part 500.

That is, the motor using the printed circuit board in accordance with still another embodiment of the present disclosure additionally locates the third base part 400 and the fourth base part 500 to be further spaced apart from each other in addition to the first base part 100 and the second base part 200, and can further include the auxiliary side part 600 therebetween.

Specifically, the auxiliary side part 600 can be formed by bending a certain portion of the third base part 400 or the fourth base part 500; the end portion of the auxiliary side part 600 bent on the third base part 400 can be coupled to the fourth base part 500; and the end portion of the auxiliary side part 600' bent on the fourth base part 500 can be coupled to the third base part 400.

The first base part 100 and the second base part 200 can be formed with the through-holes 120, 220 into which the auxiliary side parts 600, 600' are penetrated, and the auxiliary side part 600 can be connected to the third base part 400 and the fourth base part 500, respectively, by penetrating the through-holes 120, 220 of the first base part 100 and the second base part 200.

FIG. 9 is a cross-sectional diagram of a motor using a printed circuit board in accordance with yet another embodiment of the present disclosure.

As shown in FIG. 9, in the motor using the printed circuit board in accordance with yet another embodiment of the present disclosure, the side part 300 can include a first side part 310 having a certain portion bent on the first base part 100 and a second side part 320 having a certain portion bent on the second base part 200, and the end portion of the first side part 310 and the end portion of the second side part 320 can be connected to each other to form the side part 300.

That is, unlike the embodiment of FIGS. 1 to 3, the side part 300 can be formed by connecting the first side part 310 and the second side part 320. The end portions of the first side part 310 and the second side part 320 can be coupled so that the coil pattern A printed on the first side part 310 and the coil pattern A printed on the second side part 320 are successive to each other.

Particularly, in this case, it is preferable that the first base part 100 and the second base part 200 for forming the first side part 310 and the second side part 320 are cut at the outside of the space formed by a plurality of side parts 300 to which the coil patterns A are connected to form the side part. That is, the first side part 310 and the second side part 320 can be formed by bending certain portions of the first base part 100 and the second base part 200 at the outside of the closed loop space so that the coil patterns A in the closed loop space formed by the first base part 100, the second base part 200, and the side parts 300 formed of the first side part 310 and the second side part 320 are successive.

The motor using the printed circuit board in accordance with this embodiment can secure a relatively long axial length of the motor when the axial length of the motor is required to be longer than the diameter of the motor.

FIG. 10 is a flowchart of a method for manufacturing a motor using a printed circuit board in accordance with an embodiment of the present disclosure.

As shown in FIG. 10, a method for manufacturing a motor using a printed circuit board in accordance with an embodiment of the present disclosure includes printing a coil pattern on a plurality of circuit boards including a first base part and a second base part, respectively S100; locating to have the first base part and the second base part spaced apart from each other S200; and successively connecting the coils printed on the first base part and the second base part through a plurality of side parts on which the coil patterns are printed S400, S500.

In the printing the coil pattern S100, the coil pattern can be printed on the plurality of circuit boards to form the first base part and the second base part. In addition, when a separate side part is included therein, the coil pattern can be also printed on the plurality of circuit boards to form the side part.

In the locating to have the first base part and the second base part spaced apart from each other S200, the first base part and second base part on which the coil patterns are printed can be located to be spaced apart from each other. As described above, the first base part and the second base part can be also located so that the surfaces on which the coil patterns are printed face each other, and on the contrary, the surfaces on which the coil patterns are printed can be also located in the direction not facing each other.

In the successively connecting through the plurality of side parts S400, a certain portion of the first base part or the second base part can be bent to form the side part; the end portion of the side part bent on the first base part can be coupled to the second base part, and the end portion of the side part bent on the second base part can be coupled to the first base part.

Before the successively connecting through the plurality of side parts S400, the method for manufacturing the motor using the printed circuit board can further include forming a cutting line in which a part of the thickness of the circuit board is cut on the opposite surface of the surface on which the coil pattern of the first base part or the second base part is printed S300. The side part can be formed by bending a certain portion of the first base part or the second base part along the cutting line.

In another example, in the successively connecting through the plurality of side parts S500, the plurality of side parts can be separately formed by using the circuit boards printing the coil patterns, and can be also coupled to the first base part and the second base part, respectively.

In the successively connecting through the plurality of side parts S400, S500, coupling holes into which the side parts are penetrated or inserted can be formed on the first base part and the second base part, and both side end portions of the side part can be coupled to the first base part and the second base part in the state penetrated or inserted into the coupling holes formed on the first base part and the second base part.

Specifically, in the successively connecting through the plurality of side parts S400, S500, at least one end portion of the side part can be coupled to the first base part or the second base part by soldering so that the coil printed on the side part is connected to the coil printed on the first base part or the second base part.

In the successively connecting through the plurality of side parts S400, S500, a connector for successively connecting the coil printed on the first base part or the second base part to the coil printed on the side part can be used between the first base part or the second base part and the side part. That is, using the connector, one side of the connector can be connected to the coil printed on the side part and the other side of the connector can be connected to the coil printed on the first base part or the second base part, and accordingly, the coils printed on the first base part and the second base part can be successively connected through the plurality of side parts on which the coil patterns are printed.

In still another example, in the printing the coil pattern S100, the coil pattern can be printed on the plurality of circuit boards including the third base part and the fourth base part; in the locating to be spaced apart from each other S200, the third base part, the first base part, the second base part, and the fourth base part are sequentially located to be spaced apart from each other; and in the successively connecting through the plurality of side parts S400, S500, the coils printed on the third base part and the fourth base part can be successively connected through the plurality of auxiliary side parts on which the coil patterns are printed, and the plurality of auxiliary side parts can connect the third base part and the fourth base part while penetrating the through-holes formed on the first base part and the second base part.

Accordingly, the third base part and the fourth base part can be located on the outsides of the first base part and the second base part, respectively, so that the third base part, the first base part, the second base part, and the fourth base part are sequentially located to be spaced apart from each other. In addition, the coils printed on the third base part and the fourth base part can be successively connected through the plurality of auxiliary side parts on which the coil patterns are printed, and the plurality of auxiliary side parts can be connected to the third base part and the fourth base part while penetrating the through-holes formed on the first base part and the second base part.

That is, the auxiliary side parts can connect the third base part and the fourth base part through the through-holes of the first base part and the second base part, and the side part can connect between the first base part and the second base part. Accordingly, the respective printed coil patterns can be successive by the closed loop formed by the plurality of auxiliary side parts, the third base part, and the fourth base part, and the respective printed coil patterns can be successive by the closed loop formed by the plurality of side parts, the first base part, and the second base part.

Although the present disclosure has been illustrated and described in connection with the specific embodiments, those skilled in the art will appreciate that the present disclosure can be variously modified and changed without departing from the technical spirit of the present disclosure as disclosed in the accompanying claims.

What is claimed is:

1. A motor using a printed circuit board, comprising:
a first base part forming a first circuit board on which a coil pattern is printed;
a second base part forming a second circuit board on which the coil pattern is printed, the second base part spaced apart from the first base part; and
a plurality of side parts forming side circuit boards on which the coil pattern is printed, the plurality of side parts connected to the first base part and the second base part, respectively, such that the coil pattern successively connects the first base part, the second base part, and the plurality of side parts, wherein each of the side parts is formed by bending a portion of the first base part or a portion of the second base part, wherein an end portion of each of the side parts bent on the first base part is coupled to the second base part, and wherein an end portion of each of the side parts bent on the second base part is coupled to the first base part.

2. The motor using the printed circuit board according to claim 1, wherein:

a cutting line in which a part of a thickness of the first or second circuit board is cut is formed on a surface of the first base part or a surface of the second base part, and each of the side parts is formed by bending the portion of the first base part or the portion of the second base part along the cutting line.

3. The motor using the printed circuit board according to claim 2, wherein the cutting line is formed on a surface opposite of the surface on which the coil pattern is printed.

4. The motor using the printed circuit board according to claim 1, wherein the coil pattern, which is printed on the first base part, the second base part, and the plurality of side parts, is successively formed, in order, on the first base part, a bent portion of a side part among the plurality of side parts bent on the first base part, the second base part, and a bent portion of another side part among the plurality of side parts bent on the second base part.

5. The motor using the printed circuit board according to claim 1, wherein at least one of the end portions of the plurality of side parts is coupled to the first base part or the second base part by soldering.

6. The motor using the printed circuit board according to claim 1, wherein:

coupling holes into which the plurality of side parts are penetrated or inserted are formed on the first base part and the second base part, and the plurality of side parts are coupled to the first base part and the second base part such that both end portions of a particular side part are penetrated or inserted into the coupling holes formed on the first base part and the second base part.

7. The motor using the printed circuit board according to claim 1, further comprising a connector disposed between the first base part or the second base part and the plurality of side parts to successively connect a portion of the coil pattern printed on the first base part or the second base part to a portion of the coil pattern printed on the side part.

8. The motor using the printed circuit board according to claim 1, further comprising:

a third base part forming a third circuit board on which the coil pattern is printed, the third base part located at a side opposite of the second base part and spaced apart from the first base part;

a fourth base part forming a fourth circuit board on which the coil pattern is printed, the fourth base part located at a side opposite of the first base part and spaced apart from the second base part; and a plurality of auxiliary side parts forming auxiliary side circuit boards on which the coil pattern is printed, the plurality of auxiliary side parts connected to the third base part and the fourth base part, respectively, such that the coil pattern successively connects the third base part, the fourth base part, and the plurality of auxiliary side parts, wherein through-holes are formed in the first base part and the second base part, respectively, and the plurality of auxiliary side parts are connected to the third base part and the fourth base part, respectively, by penetrating the through-holes of the first base part and the second base part.

9. The motor using the printed circuit board according to claim 1, wherein:

each of the side parts includes a first side part having a portion bent on the first base part and a second side part having a portion bent on the second base part, and an end portion of the first side part and an end portion of the second side part are connected to each other to form each of the side parts.

10. A method for manufacturing a motor using a printed circuit board, comprising:

printing a coil pattern on a plurality of circuit boards including a first base part and a second base part, such that the first base part is spaced apart from the second base part; and forming a plurality of side parts on which the coil pattern is printed, the plurality of side parts connected to the first base part and the second base part, respectively, such that the coil pattern successively connects the first base part, the second base part, and the plurality of side parts, wherein a portion of the first base part or a portion of the second base part is bent to form each of the side parts, an end portion of each of the side parts bent on the first base part is coupled to the second base part, and an end portion of each of the side parts bent on the second base part is coupled to the first base part.

11. The method for manufacturing the motor using the printed circuit board according to claim 10, further comprising forming a cutting line in which a part of a thickness of the first or second circuit board is cut is formed on a surface of the first base part or a surface of the second base part, wherein each of the side parts is formed by bending the portion of the first base part or the portion of the second base part along the cutting line.

12. The method for manufacturing the motor using the printed circuit board according to claim 10, wherein at least one of the end portions of the plurality of side parts is coupled to the first base part or the second base part by soldering.

13. The method for manufacturing the motor using the printed circuit board according to claim 10, further comprising forming coupling holes into which the plurality of side parts are penetrated or inserted are formed on the first base part and the second base part, wherein the plurality of side parts are coupled to the first base part and the second base part such that both end portions of a particular side part are penetrated or inserted into the coupling holes formed on the first base part and the second base part.

14. The method for manufacturing the motor using the printed circuit board according to claim 10, further comprising forming a connector disposed between the first base part or the second base part and the plurality of side parts to successively connect a portion of the coil pattern printed on the first base part or the second base part to a portion of the coil pattern printed on the side part.

15. The method for manufacturing the motor using the printed circuit board according to claim 10, wherein the plurality of circuit boards further includes a third base part forming a third circuit board on which the coil pattern is printed, the third base part located at a side opposite of the second base part and spaced apart from the first base part, and a fourth base part forming a fourth circuit board on which the coil pattern is printed, the fourth base part located at a side opposite of the first base part and spaced apart from the second base part.

16. The method for manufacturing the motor using the printed circuit board according to claim 15, further comprising:
   forming a plurality of auxiliary side parts forming auxiliary side circuit boards on which the coil pattern is printed, the plurality of auxiliary side parts connected to the third base part and the fourth base part, respectively, such that the coil pattern successively connects the third base part, the fourth base part, and the plurality of auxiliary side parts; and
   forming through-holes in the first base part and the second base part, respectively, and the plurality of auxiliary side parts are connected to the third base part and the fourth base part, respectively, by penetrating the through-holes of the first base part and the second base part.

* * * * *